US 6,831,775 B2

(12) United States Patent
Matsushita et al.

(10) Patent No.: US 6,831,775 B2
(45) Date of Patent: Dec. 14, 2004

(54) METHOD AND APPARATUS FOR WAVELENGTH CONVERSION

(75) Inventors: Shunichi Matsushita, Tokyo (JP); Osamu Aso, Tokyo (JP); Misao Sakano, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 283 days.

(21) Appl. No.: 10/053,231

(22) Filed: Jan. 17, 2002

(65) Prior Publication Data

US 2002/0163689 A1 Nov. 7, 2002

(30) Foreign Application Priority Data

Mar. 30, 2001 (JP) ........................................ 2001-100719

(51) Int. Cl.[7] ................................................. G02F 2/02
(52) U.S. Cl. ................................................... 359/326
(58) Field of Search ................................. 359/326–332; 372/21–22

(56) References Cited

U.S. PATENT DOCUMENTS

| | | | | | |
|---|---|---|---|---|---|
| 4,881,790 | A | * | 11/1989 | Mollenauer | 398/180 |
| 6,101,024 | A | * | 8/2000 | Islam et al. | 359/334 |
| 6,271,960 | B1 | * | 8/2001 | Michishita et al. | 359/326 |
| 6,330,104 | B1 | * | 12/2001 | Kim et al. | 359/332 |
| 6,529,314 | B1 | * | 3/2003 | Shukunami et al. | 359/332 |
| 6,657,773 | B2 | * | 12/2003 | Chiaroni et al. | 359/326 |
| 2001/0007509 | A1 | * | 7/2001 | Aso et al. | 359/326 |

OTHER PUBLICATIONS

Shibata et al. "Phase–Mismatch Dependence of Efficiency of Wave Generation Through Four–Wave Mixing in a Single–Mode Optical Fiber". (1987) IEEE Journal of Quantum Electronics. vol. OE–23 No 7. pp. 1205–1210.
Aso et al. "Broadband Four–Wave Mixing Generation in Short Optical Fibres". (2000) Electronic Letters. vol. 36 No 8. pp. 709–711.
Watanabe et al. "Interband Wavelength Conversion of 320 Gb/s (32x10 Gb/s) WDM Signal Using a Polarization–Insensitive Fiber Four–Wave Mixer". (1998) ECOC 98. 20–24. Madrid, Spain. pp. 85. 87 (Sep. 20–24, 1998).

* cited by examiner

*Primary Examiner*—John D. Lee
(74) *Attorney, Agent, or Firm*—Oblon, Spivak, McClelland, Maier & Neustadt, P.C.

(57) ABSTRACT

A wavelength converting method and apparatus which converts wavelength division multiplexed (WDM) signal light, having a plurality of channels, by four-wave mixing the WDM signal light with at least one pump lightwave. Wavelength conversion of the WDM signal is accomplished without producing noise by FWM the WDM signal with a pump lightwave, wherein the pump lightwave frequency is separated from the WDM signal by an interval equal to or greater than the bandwidth of the WDM signal. Two pump lightwaves can be used instead of one, wherein one of the pump lightwaves has a frequency on one side of the bandwidth of the WDM signal, and the average frequency of the two pump lightwaves is on the other side of the WDM signal bandwidth.

11 Claims, 7 Drawing Sheets

METHOD AND APPARATUS FOR WAVELENGTH CONVERSION

BACKGROUND OF THE INVENTION

1. Field of the Invention

The present invention relates to wavelength conversion, and more particularly to wavelength conversion using four wave mixing.

2. Description of the Related Art

A wavelength division multiplexed (WDM) signal generally consists of a plurality of optical channels. An optical-electrical-optical wavelength conversion system typically converts a WDM signal from a low frequency band to a high frequency band, or from a high frequency band to a low frequency band using a plurality of photodiodes and laser diodes corresponding to the optical channels of the signal and the desired frequency band for conversion. The use of a large number of photodiodes and laser diodes for such a conversion system requires significant assembly, and consequently increases the size and cost of the system.

In addition, depending on the frequency band of the signal to be converted, laser diodes having a wavelength corresponding to the frequency band to which the signal is to be converted to may not be available. Furthermore, due to the limit in response speed in the optical-electric and electric-optical conversion processes, the transfer speed of the signal is also limited.

Another method of wavelength conversion of a WDM signal comprises four-wave mixing (FWM). FWM combines the WDM signal and pump light in a non-linear medium. Due to the high response speed of an FWM process, it can cope with faster transfer speeds of signal light as compared to an optical-electrical-optical wavelength converter.

Wavelength conversion employing FWM, however, typically generates noise in the frequency bands both above and below the frequency of the pump light in addition to the wavelength converted WDM signal. The noise originates from one of generative FWM (improper) phenomenon wherein at least one of a plurality of optical channels of a WDM signal (before wavelength conversion) is used as pump light for the other channels. This noise generation degrades the quality of a WDM signal following wavelength conversion.

SUMMARY OF THE INVENTION

In one embodiment, the invention comprises a method of wavelength converting an optical signal. The method may comprise combining one or more pump lightwaves with said optical signal in a conversion medium, and producing a converted output optical signal spanning a frequency band outside of a frequency band that contains noise signals produced by improper four-wave mixing in said conversion medium.

A variety of specific embodiments are provided and described. In one embodiment, a method comprises four-wave mixing the optical signal channels and a pump lightwave in a conversion medium and selecting a frequency for the pump lightwave such that the frequency difference between any selected optical signal channel frequency and the pump lightwave frequency is approximately equal to or greater than the frequency bandwidth spanned by the plurality of optical signal channels. In another embodiment, a method comprises four-wave mixing, in a conversion medium, the plurality of optical signal channels and first and second pump lightwaves having first and second frequencies respectively. In this embodiment, frequencies for the first and second pump lightwaves may be selected such that (1) the optical signal channel frequencies lie between the first pump lightwave frequency and an average frequency of the two pump lightwave frequencies, and (2) the frequency difference between the first and second pump frequencies is at least about four times the frequency span of the optical signal channels.

In another embodiment, an apparatus for producing wavelength converted light comprises a conversion medium, coupled to receive as inputs a wavelength division multiplexed (WDM) optical signal and a pump lightwave, wherein the WDM optical signal has a bandwidth WBW, and wherein the frequency of said pump lightwave is at least WBW different from the frequencies present in the WDM optical signal.

In another embodiment, a wavelength converter for converting the wavelength of a signal light comprises a first branch having a single pump source and a second branch having a plurality of pump sources.

In another embodiment of the invention, a multifrequency light source comprises N light sources, a multiplexer having the N light sources as an input and a multiplexed output; and a wavelength converter having the multiplexed output as an input and having 2N optical signal outputs.

DETAILED DESCRIPTION OF THE PREFERRED EMBODIMENT

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

Four-wave mixing (FWM) is a phenomenon wherein three optical lightwaves of different frequencies (wavelengths), travelling in a conversion nonlinear medium, interact with one another due to the nonlinear polarization optical effect of the conversion medium. This interaction generates an additional optical signal having a different frequency from the three original signals.

The basic principle of FWM-based wavelength conversion can be described as follows. Given three different optical lightwaves having frequencies $\omega_1$, $\omega_2$ and $\omega_3$ respectively, travelling in a conversion medium, and the frequency of the signal generated by FWM is given by $\omega_c$, the following equation is satisfied:

$$\omega_c = \omega_1 + \omega_2 - \omega_3 \quad \omega_2 \neq \omega_3 \tag{1}$$

Figure 1:
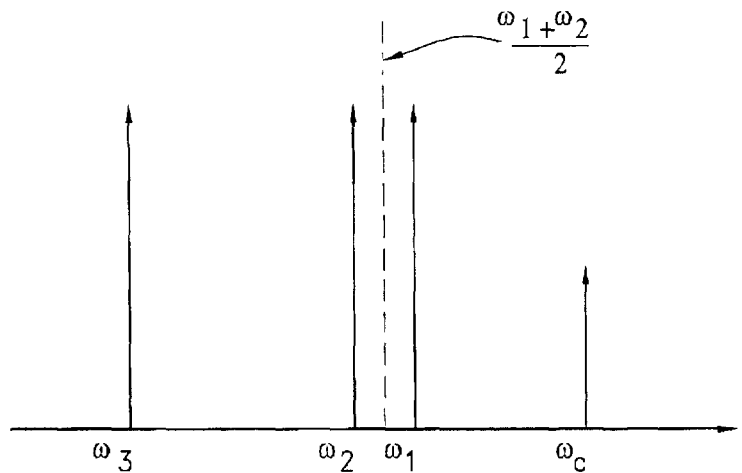
FIG. 1 is an exemplary graphical illustration of the basic principle of FWM-based wavelength conversion.

The frequency $\omega_c$ of the generated (wavelength converted) signal appears at a location symmetric to the frequency $\omega_3$ mirrored about the average frequency $((\omega_1 + \omega_2))/2)$ of the other two signals $\omega_1$, $\omega_2$, as illustrated in FIG. 1.

Given that $\omega_p$ is the frequency of the FWM-originating pump lightwave, and $\omega_s$ is the frequency of the signal lightwave, and letting $\omega_1 = \omega_2 = \omega_p$ and $\omega_3 = \omega_s$ in equation (1), the following equation is satisfied:

$$\omega_c = 2\omega_p - \omega_s \tag{2}$$

Figure 2:
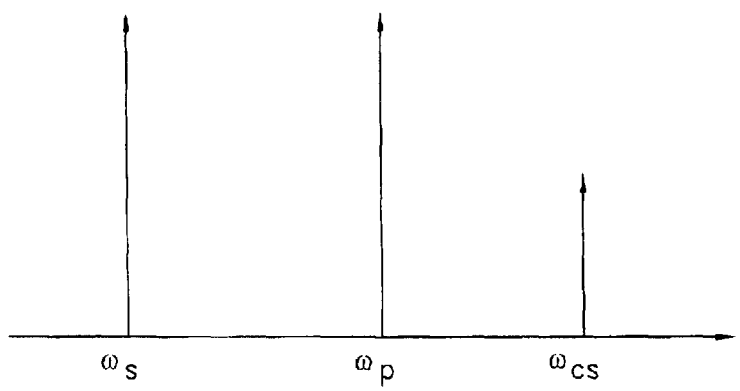
FIG. 2 is an exemplary graphical illustration of degenerate FWM phenomenon.

This FWM phenomenon is referred to as degenerate FWM phenomenon, wherein the wavelength converted signal $\omega_{cs}$ appears on the frequency axis at a position symmetric to the frequency $\omega_s$ of the signal lightwave, mirrored about the frequency $\omega_p$ of the pump light as shown in FIG. 2.

In the event the signal light is a WDM signal consisting of multiple (n) channels and subjected to simultaneous wavelength conversion by FWM, the following problem arises. The WDM signal is subjected to simultaneous wavelength conversion as expressed by equation (2). At the same time, however, an improper FWM phenomenon occurs between one of the components of the WDM signal (multiple channels) and the pump lightwave, having the frequency $\omega_p$, which produces a wavelength converted signal based on the improper FWM phenomenon.

As mentioned above, the wavelength converted signal may generate noise, wherein the mode of generation is considered as follows. Assume the frequency $\omega_p$ of the pump lightwave is off the frequency band of the WDM signal light before wavelength conversion, and the frequencies of the WDM signal light are "$\omega_{s1}$," "$\omega_{s2}$" and so forth, in order from the frequency closest to the frequency $\omega_p$ of the pump lightwave, wherein the i-th channel frequency is $\omega_{s1}$ and the j-th channel frequency is $\omega_{sj}$. Furthermore, let $\omega_{nij}$ be the frequency of the noise signal generated by FWM, which is called improper FWM in this invention. The following equation can now be satisfied.

$$\omega_{nij} = \omega_p + \omega_{si} - \omega_{sj} \tag{3}$$

The frequency of the noise signal that is generated at the position closest to the frequency $\omega_p$ of the pump lightwave is determined by the two channels (whose frequencies are $\omega_{sj}$ and $\omega_{si}$, respectively) among the channels of the WDM signal prior to wavelength conversion which have the minimum frequency interval. Therefore, the frequencies of noise signals ($\omega_{n1}$ and $\omega_{n-1}$) generated by improper FWM of the two channels and the pump lightwave are the closest to the frequency $\omega_p$ of the pump lightwave.

Figure 3:
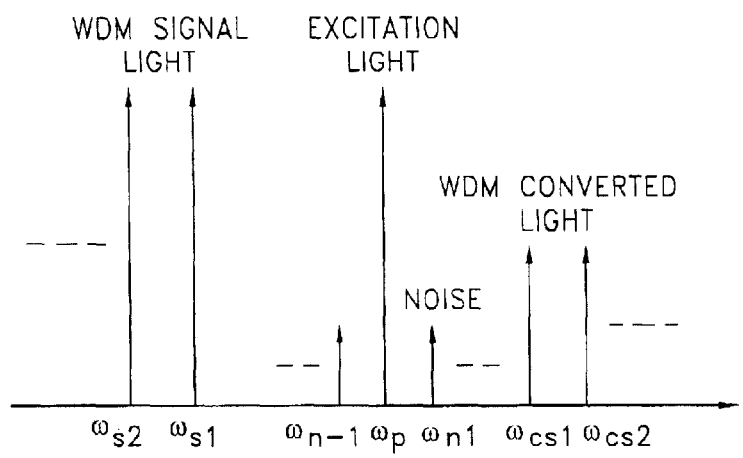
FIG. 3 is an exemplary graphical illustration of FWM of a WDM signal with an pump lightwave.

FIG. 3 illustrates the position on the frequency axis of the WDM converted signals produced by FWM with respect to the channel frequencies $\omega_{s1}$ and $\omega_{s2}$ of the WDM signal, and noise signals generated by improper FWM between $\omega_{si}$ and $\omega_{sj}$. As shown, the WDM signals of channel frequencies $\omega_{s1}$ and $\omega_{s2}$ are produced as converted signals of frequencies $\omega_{c1}$ and $\omega_{c2}$ at symmetric positions mirrored about the frequency position $\omega_p$ of the pump lightwave. The noise signals at frequencies $\omega_{n1}$ and $\omega_{n-1}$ are produced at the positions closest to the frequency $\omega_p$ of the pump lightwave.

The frequency of the noise generated by improper FWM which is farthest from the frequency $\omega_p$ of the pump lightwave, is determined by the frequencies $\omega_{sj}$ and $\omega_{si}$ of the two channels which have the largest frequency difference. Specifically, the frequency of the noise is determined by the absolute value of the difference between the frequency $\omega_{s1}$ of the channel closest to the frequency $\omega_p$ of the pump lightwave in the frequency band of the WDM signal light before wavelength conversion, and the frequency of the channel farthest from the frequency $\omega_p$ of the pump lightwave in the frequency band of the WDM signal light before wavelength conversion. In prior art FWM wavelength converters, this produces a noise signal frequency which is inside the frequency band where the WDM signal prior to wavelength conversion is positioned.

With reference to the frequency axis, the frequencies of the noise which are farthest from the frequency $\omega_p$ of the pump lightwave lie on the respective sides of the frequency $\omega_p$ of the pump lightwave, one on each side, and the interval between the two frequencies is equal to the frequency bandwidth where the WDM signal lies. Therefore, the noise signal frequencies are positioned on the frequency axis on the respective sides of the frequency $\omega_p$ of the pump lightwave, with a total frequency bandwidth twice the frequency bandwidth of the WDM signal prior to wavelength conversion. As shown in FIG. 3, the generated noise signals lie dispersed along the frequency band wherein the interval between the noise frequencies is determined by the separation between signal channels, and the frequency $\omega_p$ of the pump lightwave is at the center improper.

In one embodiment, a first method of wavelength conversion uses a single pump lightwave to prevent the frequency band of the noise signals generated by improper FWM from overlapping the frequency band of WDM converted light after wavelength conversion, and the frequency band of WDM converted light prior to wavelength conversion. The wavelength conversion method sets the frequency band of noise signals (herein after referred to as "guard band") such that the guard band is centered around the frequency $\omega_p$ of the pump light and separates the noise signals from the WDM converted signals in a way such that the frequency band of the WDM converted signal lies outside the guard band. In the event the interval between the frequency $\omega_{s1}$ closest to the frequency $\omega_p$ of the pump lightwave in the WDM signal lightwave, prior to wavelength conversion, and the frequency $\omega_p$ of the pump lightwave is wider than the frequency bandwidth where the WDM signal light prior to wavelength conversion lies, then the frequency bandwidth of the noise signals do not overlap the frequency bandwidth of the wavelength-converted signals.

Assume WDM signal light prior to wavelength conversion consists of n channels spread over a signal bandwidth of WBW. Also assume that the frequency intervals between the channels are equal to one another and have a value $\delta\omega$, the interval between the frequency $\omega_p$ of the single pump lightwave to be used and the frequency $\omega_{s1}$ among the frequencies of the WDM signal which is closest to the frequency $\omega_p$ of the pump lightwave is $\Delta\omega$, and the i-th frequency of the WDM signal from the frequency $\omega_p$ of the pump lightwave The i-th frequency $\omega_{si}$ of the WDM signal is given by the following equation:

$$\omega_{si}=\omega_p-\Delta\omega-(n-i)\cdot\delta\omega \qquad (4)$$

$$(1\leq i\leq n)$$

Although in the above example the frequency of the WDM signal is set to a position in a frequency band lower than the frequency $\omega_p$ of the pump lightwave in this case, the results of the analysis do not change even if the frequency of the WDM signal is positioned in a frequency band higher than that frequency $\omega_p$ of the pump lightwave. Therefore, the generality will not be lost even if the frequency of the WDM signal lies in either a frequency band lower than the frequency $\omega_p$ of the pump lightwave, or in a frequency band higher than the frequency $\omega_p$ of the pump light.

Substituting equation (4) into equation (2), the frequency $\omega_{csk}$ of the converted WDM optical signal becomes as given by the following equation.

$$\omega_{csk}=\omega_p+\Delta\omega+(n-k)\cdot\delta\omega \qquad (5)$$

Substituting equation (4) into equation (3), the frequency $\omega_{nji}$ of the noise signal becomes as given by the following equation, wherein $\omega_{nji}$ in equation (3) is $\omega_{nk}$.

$$\omega_{nk}=\omega_p-(j-i)\cdot\delta\omega=\omega_p+k\cdot\partial\omega \qquad (6)$$

$$(1\leq i,j\leq n, i\neq j, k=i-j)$$

Presently, the number of available combinations of the channels $\omega_j$ and $\omega_i$ of the WDM signal that generates noise signals at the same frequency $\omega_{nk}$ is the number of combinations of (i,j) that satisfy k=i−j. For example, the number of combinations of (i,j) that satisfy k=1 is (n−1), the number of combinations of (i,j) that satisfy k=r is (n−r), and there is only one combination of (i,j) that satisfies k=n.

Because |k| takes a value from 1 to n−1, the frequency $\omega_{nk}$ of the noise signal generated by improper FWM at the time of performing wavelength conversion of the WDM signal is given by the following equation.

$$\omega_p-(n-1)\cdot\delta\omega\leq\omega_{nk}\leq\omega_p+(n-1)\cdot\delta\omega \qquad (7)$$

When the channel of the frequency $\omega_{sk}$ of the WDM signal is wavelength-converted to a WDM converted signal of a frequency $\omega_{csk}$ by FWM, the frequency bandwidth where the WDM converted signal lies is given by the following equation based on equation (5).

$$\omega_p+\Delta\omega\leq\omega_{csk}\leq\omega_p+\Delta\omega+(n-1)\cdot\delta\omega \qquad (8)$$

As can be seen from equation (7), the frequency $\omega_{nk}$ of the noise signal spreads extensively on both sides of the frequency $\omega_p$ of the pump lightwave so as to have the frequency bandwidth of the WDM signal, (n−1)$\delta\omega$, while maintaining the equal frequency interval $\delta\omega$ between channels of the WDM signal prior to wavelength conversion.

As can be seen from equation (8), the WDM converted signal is located on the opposite side of the frequency band of the WDM signal prior to wavelength conversion, centered about the frequency $\omega_p$ of the pump lightwave. The WDM converted signal extends by equal intervals of $\delta\omega$ to the position of the frequency (n−1)$\delta\omega$ from the position of the frequency, separated by $\Delta\omega$, from the frequency $\omega_p$ of the pump lightwave.

Figure 4:
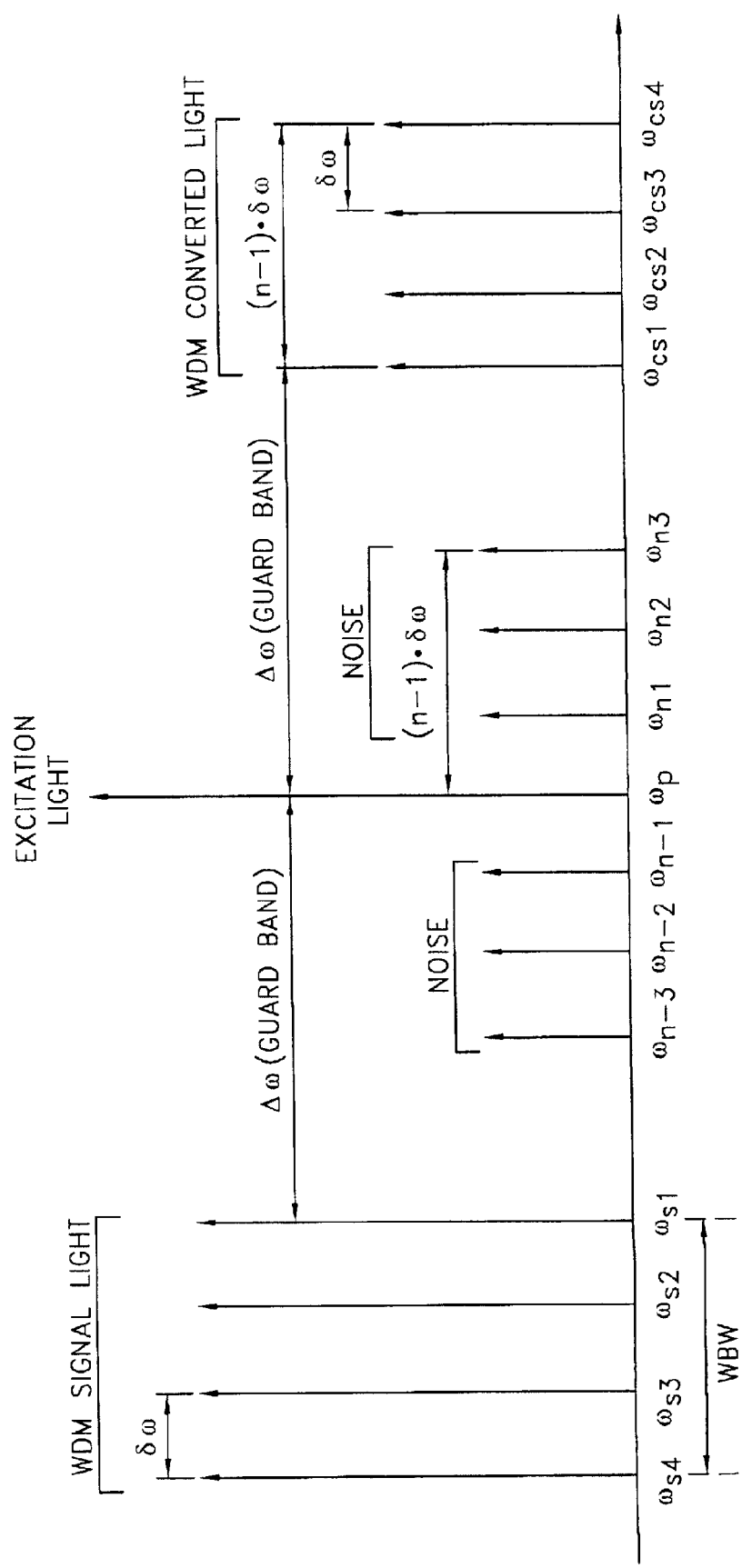
FIG. 4 is an exemplary graphical illustration of FWM of a WDM signal according to a first method of wavelength conversion.

FIG. 4 is an exemplary, graphical illustration of the positional relationship of the WDM signal prior to wavelength conversion, the WDM converted signal after wavelength conversion, and noise on the frequency axis. As shown in FIG. 4, the WDM signal prior to wavelength conversion, having a frequency band of (n−1)$\delta\omega$, and the WDM converted signal after wavelength conversion having the frequency band (n−1)$\delta\omega$, are positioned at mirror symmetric locations on the frequency axis, centered about the frequency $\omega_p$ of the pump lightwave. Noise, having a frequency bandwidth of (n−1)$\delta\omega\cdot 2$, is positioned on both sides of the frequency $\omega_p$ of the pump lightwave, and between the channel of the frequency $\omega_{s1}$ of the WDM signal prior to wavelength conversion and the channel of the frequency $\omega_{cs1}$ of the WDM converted signal after wavelength conversion.

In order to prevent the noise signal frequency band, where the frequency $\omega_{nk}$ is positioned, from overlapping the frequency band where the channel frequency $\omega_{csk}$ of the WDM converted signal lies, a interval between pump lightwave and closest channel in WDM optical signal lightwave, $\Delta\omega$, should be grater than or equal to the frequency bandwidth of WDM optical signal lightwave.

Deriving the aforementioned relationship using equations (7) and (8) yields the following equation:

$$\Delta\omega\geq(n-1)\cdot\delta\omega \qquad (9)$$

As can be seen from equation (9) and FIG. 4, when the interval $\Delta\omega$ between the frequency $\omega_p$ of the pump lightwave and the frequency $\omega_{s1}$, among the frequencies of the WDM signal prior to wavelength conversion which is closest to the frequency $\omega_p$, is greater than or equal to the frequency band (n−1)$\delta\omega$ of the WDM signal, the frequency band of the noise signal generated by improper FWM can be prevented from overlapping the frequency band of the WDM converted signal after wavelength conversion. That is, when the interval between the $\omega_p$ of the pump lightwave and one of the WDM signal prior to wavelength conversion which is closest to the frequency $\omega_p$ has been determined, the WDM signal prior to wavelength conversion should have an upper limit of $\Delta\omega$ in order to prevent the frequency band of the noise signal generated by improper FWM from overlapping the frequency band of the WDM converted signal.

The maximum number of channels, n, of WDM optical signals which have the frequency interval equal to $\delta\omega$ can be determined by the value of n that satisfies the following equation.

$$\Delta\omega=(n-1)\cdot\delta\omega \qquad (10)$$

The maximum value of the bandwidth of the WDM signal becomes $\Delta\omega$.

In the event the interval between the $\omega_p$ of the pump lightwave and the channel of the WDM signal closest to the frequency $\omega_p$ is set equal to the bandwidth of the WDM signal, the frequency bandwidth, $F_w$, from the pump lightwave to the farthest channel frequency of the WDM converted signal, is given by the following equation.

$$\Delta\omega = (n-1)\cdot\delta\omega = \frac{F_W}{2} \qquad (11)$$

When equation (11) is satisfied, the WDM converted signal is converted into the band $\Delta\omega$ away from the frequency $\omega_p$ of the pump lightwave, and the noise lies only in the band of the interval $\Delta\omega$ from the frequency $\omega_p$ of the pump lightwave.

In one advantageous embodiment, the frequency $\omega_p$ of the pump lightwave in the foregoing description is set equal to or close to a frequency equivalent to the zero dispersion wavelength of the conversion medium, wherein the conversion efficiency of FWM can be enhanced.

In this description, the band of the interval $\Delta\omega$ having one end at the frequency $\omega_p$ of the pump lightwave is referred to as the "guard band." The guard band is a frequency bandwidth which is set on either side of the pump lightwave such that the bandwidth on one side is equal to or wider than that of the WDM signal.

In a first embodiment of a wavelength converter, the conversion medium can be implemented with a 100 m high nonlinearity dispersion shifted fiber (HNL-DSF) with a zero dispersion wavelength of 1564 nm, 191.7 THz. The frequency $\omega_p$ of the pump lightwave can be set to 191.7 THz, the width ($\Delta\omega$) of the guard band set to 3.4 THz, and the channel quantity n set to 18, wherein WDM signal light in a C band (1530 to 1565 nm) can be converted to an L band (1565 to 1625 nm). An optical spectrum of the wavelength conversion is shown in FIG. 5.

Figure 5:
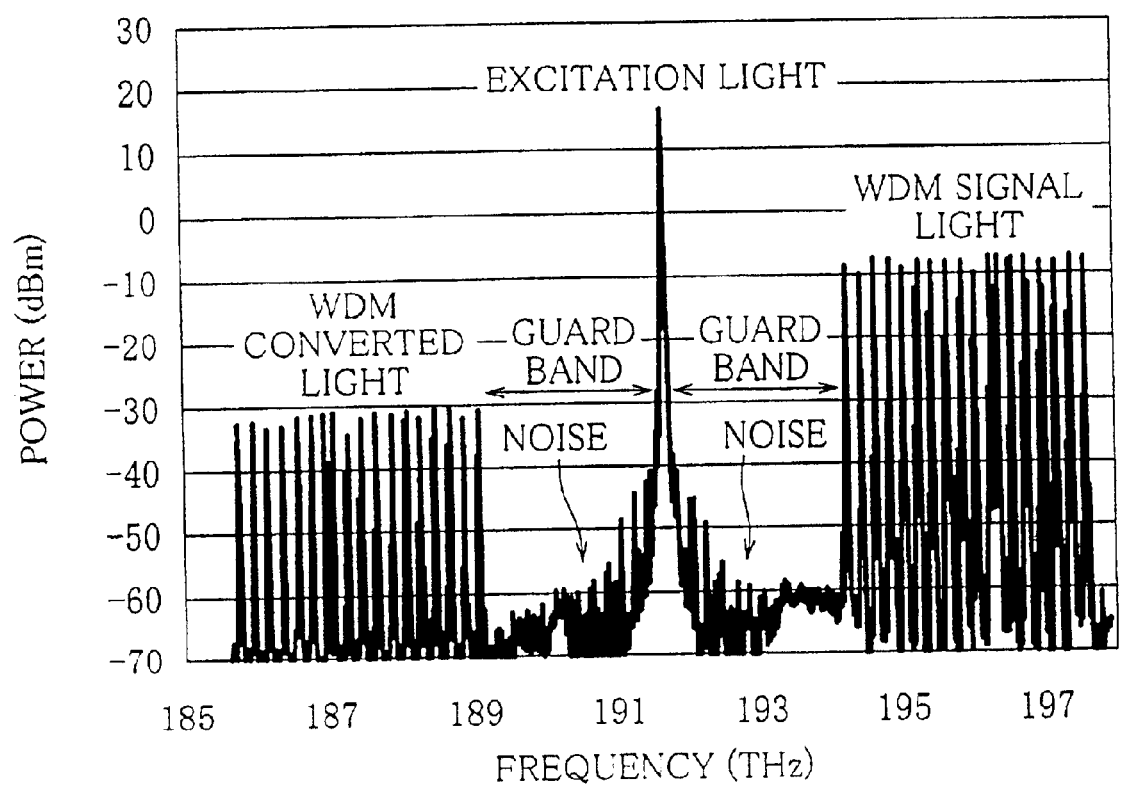
FIG. 5 is an optical spectrum illustrating wavelength conversion according to a first embodiment of a wavelength converter.

In FIG. 5, the frequency band of the WDM converted signal does not overlap the frequency band of the noise.

Due to the resultant signal to noise ratio (SNR) after wavelength conversion equal to or greater than 30 dB, the qualities of the obtained signals are not degraded by the noise. It is therefore possible to acquire the wavelength converted WDM signal without producing noise by extracting only WDM converted light by using, for example, a band pass filter.

According to the first embodiment of wavelength conversion, the frequency bandwidth of the WDM signal to be converted should be restricted, and a guard band should be set on both sides of the frequency $\omega_p$. Therefore, the bandwidth usable in signal transfer is decreased by setting the guard band. Specifically, if the band usable in signal transfer consist of the frequency band from $\omega_p$ to the farthest channel frequency of the WDM converted signal from the $\omega_p$, the frequency band usable in signal transfer is reduced by half.

In general, wavelength conversion of WDM optical signals by FWM causes noise signal frequencies generated by improper FWM to lie at mirror symmetric positions, centered about the frequency $\omega_p$ of the pump light. In the event the frequency intervals between the channels of the WDM signal are all equal to $\delta\omega$, the range of the noise signal frequencies starts at the position which is separated from the frequency $\omega_p$ of the pump light by $\delta\omega$ and ends at the position which is separated from the frequency $\omega_p$ of the pump lightwave by the frequency bandwidth of the WDM signal.

If the interval $\Delta\omega$ would be satisfied an equation (12), degradation of signal and noise ratio would be avoided in the case of slight overlapping the band of WDM optical signals and that of noise. The noise signal and the converted WDM optical signals don't overlap each other in this condition.

$$\Delta\omega \neq m \cdot \delta\omega \ (m=1,2,\ldots) \tag{12}$$

In the above described embodiment, setting the frequency band spread from the frequency $\omega_p$ of the pump light by the frequency bandwidth of the WDM signal light as the guard band results in a potential limitation on the signal frequencies which can be converted without overlapping the noise signals.

A second embodiment of a wavelength converter will now be described which eliminates this potential restriction on suitable signal frequencies. The second wavelength conversion method comprises a two-pump-light wavelength converting method which executes FWM by using two pump lightwaves of different frequencies and sets a guard band as a frequency band for noise.

As wavelength conversion is carried out by FWM using two pump lightwaves of different frequencies $\omega p1$ and $\omega p2$, wavelength conversion of the WDM optical signal, described by equation (2), is accomplished with the average frequency of the two pump lightwaves as the center. Noise signal frequencies originating from improper FWM, given by equation (3), are produced with the frequencies $\omega_{p1}$ and $\omega_{p2}$ of the individual pump lightwaves as their centers.

If $\omega_0$ is the frequency equivalent to the zero dispersion wavelength of the conversion medium, the average frequency of the frequencies $\omega_{p1}$ and $\omega_{p2}$ of the two pump lightwaves may be matched with the frequency $\omega_0$. Let us consider the case where the frequency band between the frequency $\omega_0$ and the frequency $\omega_{p1}$ and the frequency band between the frequency $\omega_0$ and the frequency $\omega_{p2}$ have the frequency bandwidth $F_w$. The frequency bandwidth $F_w$ can be determined so as to prevent the channels of the WDM converted signals from overlapping the noise signal frequencies produced by improper FWM.

Letting $\omega_{p1}<\omega_{p2}$, it follows that $\omega_{p1}$, $\omega_{p2}$, $F_w$ and $\omega_0$ satisfy the following equations:

$$\omega_{p1}=\omega_0-F_w \tag{13}$$

$$\omega_{p2}=\omega_0+F_w \tag{14}$$

Further, the WDM signal prior to wavelength conversion consists of n channels having the equal frequency interval $\delta\omega$, and the frequency interval between the frequency of $\omega_0$ and the frequency of the WDM signal that is closest to the former frequency is $\Delta\omega$. Furthermore, $\omega_{si}$ is the frequency of the i-th channel of the WDM signal light as counted from the frequency closest to the average frequency $\omega_0$ of the two pump lights, and $\omega_{csi}$ is the frequency of the channel of the WDM converted signal which is produced by FWM-based wavelength conversion of the channel of the frequency $\omega_{si}$.

The frequency $\omega_{csi}$ of the optical channel resulting from the wavelength conversion of the channel of the frequency $\omega_{s1}$, centered about the average of the frequencies $\omega_{p1}$ and $\omega_{p2}$ of the two pump lights, is given by the following equation:

$$\omega_{csi}=\omega_{p1}+\omega_{p2}-\omega_{si}=2\omega_0-\omega_{si} \tag{15}$$

In this example, the frequency of each channel of the WDM signal lies in a frequency band lower than the average frequency $\omega_0$ of the two pump lights. As described above, however, even if the frequency of each channel of the WDM signal lies in a frequency band higher than the average frequency $\omega_0$ of the two pump lights, the results of the analysis do not change. Therefore, the generality will not be lost regardless of whether the frequency of each channel of the WDM optical signal lies in a frequency band lower than or higher than the average frequency $\omega_0$ of the two pump lights.

Given that $\omega_{njip1}$ is the frequency of the noise generated by the optical channels of frequencies $\omega_{si}$ and $\omega_{sj}$ in the WDM signal prior to wavelength conversion and the first pump lightwave of the frequency $\omega_{p1}$, the following equation is satisfied:

$$\omega_{njip1}=\omega_{p1}+\omega_{sj}-\omega_{si} \ (i \neq j) \tag{16}$$

Given that $\omega_{njip2}$ is the frequency of the noise signal generated by optical channels of frequencies $\omega_{si}$ and $\omega_{sj}$ in the WDM signal prior to wavelength conversion and the second pump lightwave of the frequency $\omega_{p2}$, the following equation is satisfied:

$$\omega_{njip2}=\omega_{p2}+\omega_{sj}-\omega_{si} \; (i \neq j) \tag{17}$$

As the frequency band of the WDM signal prior to wavelength conversion is set between the average frequency $\omega_0$ of the two pump lightwaves and the frequency $\omega_{p1}$ of the first pump lightwave, the frequency $\omega_{si}$ of the i-th channel of the WDM signal light is given by the following equation:

$$\omega_{si}=\omega_0-\Delta\omega-(i-1)\cdot\delta\omega \; (1 \leq i \leq n) \tag{18}$$

Because the frequency $\omega_{csi}$ of the optical channel in the WDM converted signal that is produced with the average frequency $\omega_0$ of the two pump lightwaves as the center is given by equation (15), the frequency $\omega_{csi}$ is given by the following equation by substituting equation (16) into equation (15):

$$\omega_{csi}=\omega_0+\Delta\omega+(i-1)\cdot\delta\omega \tag{19}$$

Since the frequency $\omega_{njip1}$ of the noise signal generated by the optical channels with frequencies $\omega_{si}$ and $\omega_{sj}$ in the WDM signal prior to wavelength conversion and the first pump lightwave with the frequency $\omega_{p1}$ is given by equation (16), the frequency $\omega_{njip1}$ of the noise signal is given by the following equation by substituting equation (18) into equation (16):

$$\omega_{njip1}=\omega_{p1}+(i-j)\cdot\delta\omega \tag{20}$$

Since the frequency $\omega_{njip2}$ $$\omega_{njip2}=\omega_{p2}+(i-j)\cdot\delta\omega \tag{21}$$

Where the WDM signal consists of n channels with the equal frequency interval $\delta\omega$, $1 \leq i \leq n$ and $1 \leq j \leq n$, and where setting k=i-j, |k| takes on a value from 1 to (n-1).

The frequency bands of the noise signal frequencies $\omega_{njip1}$ and $\omega_{njip2}$ that are produced by improper FWM are respectively given by the following equations:

$$\omega_{p1}-(n-1)\cdot\delta\omega \leq \omega_{njip1} \leq \omega_{p1}+(n-1)\cdot\delta\omega \tag{22}$$

$$\omega_{p2}-(n-1)\cdot\delta\omega \leq \omega_{njip2} \leq \omega_{p2}+(n-1)\cdot\delta\omega \tag{23}$$

As can be seen from equation (19), the frequencies of the WDM converted signal start at the frequency separated from the average frequency $\omega_0$ of the two pump lightwaves by the interval $\Delta\omega$, and the frequency bandwidth is the same as the frequency bandwidth of the WDM signal prior to wavelength conversion.

Meanwhile, the frequency bandwidths of the noise signals are given by equations (22) and (23). Specifically, the frequencies of the noise signal produced by improper FWM with the first pump lightwave are produced at the mirror symmetric positions on both sides of the frequency $\omega_{p1}$ of the first pump lightwave, and extend the frequency bandwidth with that of the WDM signal.

The frequencies of the noise signal generated by improper FWM with the second pump lightwave are produced at the mirror symmetric positions on both sides of the frequency $\omega_{p2}$ of the second pump lightwaves and extend the frequency bandwidth with that of the WDM signal prior to wavelength conversion. The frequency bandwidth for these noise signals is twice the frequency bandwidth of the WDM signal.

Because the frequency band of the WDM signal prior to wavelength conversion lies between the average frequency $\omega_0$ of the two pump lightwaves and the frequency $\omega_{p1}$ of the first pump lightwave, the frequency band of the WDM converted signal lies between the average frequency $\omega_0$ of the two pump lightwaves and the frequency $\omega_{p2}$ of the second pump lightwave.

Given that $\omega_{csisup}$ is the upper limit of the channel frequencies $\omega_{csi}$ of the WDM converted signal that are produced with the average frequency $\omega_0$ of the two pump lightwaves as the center or the highest frequency, the frequency $\omega_{csisup}$ can be derived from equation (19), and given by the following equation:

$$\omega_{csisup}=\omega_0+\Delta\omega+(n-1)\cdot\delta\omega \tag{24}$$

Given that $\omega_{njip2inf}$ is the lower limit of the noise signal frequencies that are produced by improper FWM with the second pump lightwave of the frequency $\omega_{p2}$ and the optical channels with frequencies $\omega_{si}$ and $\omega_{sj}$ of the WDM signal or the lowest frequency, the frequency $\omega_{njip2inf}$ can be derived from equation (23) and given by the following equation:

$$\omega_{njip2inf}=\omega_{p2}-(n-1)\delta\omega \tag{25}$$

If the upper limit $\omega_{csisup}$ of the optical channel frequencies of the WDM converted signal is lower than the lower limit $\omega_{njip2inf}$ of the noise signal frequencies produced by improper FWM with the second pump lightwave of the frequency $\omega_{p2}$, the noise signal frequency and the optical channel frequency of the WDM converted signal after wavelength conversion, which lie between the average frequency $\omega_0$ of the two pump lightwaves and the frequency $\omega_{p2}$ of the second pump light, do not overlap each other. That is, if the following equation is satisfied, the noise signal frequency and the optical channel frequency of the WDM converted signal do not overlap each other.

$$\omega_{csisup} < \omega_{njip2inf} \tag{26}$$

Rewriting equation (26) using equations (14), (24) and (25) yields the following equation:

$$F_w=\omega_{p2}-\omega_0 > \Delta\omega+2(n-1)\cdot\delta\omega \tag{27}$$

As the frequency interval between the optical channels in the WDM signal prior to wavelength conversion having the minimum frequency interval and the average frequency $\omega_0$ of the two pump lightwaves, can be set to, ideally, the channel frequency of the WDM converted signal, and the noise signal frequency do not overlap if $F_w$, the frequency interval between the average frequency $\omega_0$ of the two pump lightwaves and the frequency $\omega_{p2}$ of the second pump lightwave, is set equal to or greater than twice the frequency bandwidth of the WDM signal prior to wavelength conversion, as is apparent from equation (27).

It is possible to prevent the band of the WDM converted signal and the noise band 1 from overlapping each other by setting guard band with bandwidth which would be equal to or wider than the frequency bandwidth of the WDM signal, on both sides of the frequencies $\omega_{p1}$ and $\omega_{p2}$ of the pump lightwaves. In this case, the width of the guard bands are equal to or greater than twice the frequency bandwidth of the WDM signal prior to wavelength conversion, and are centered about the frequencies $\omega_{p1}$ and $\omega_{p2}$ of the pump lights.

The foregoing description has been given of the case where the frequency bandwidth of WDM signal prior to wavelength conversion is set between the average frequency $\omega_0$ of the two pump lightwaves and the frequency $\omega_{p1}$ of the first pump lightwave. The same explanation, however, is also applicable to the case where the conversion band $F_w$ is determined by setting the frequency bandwidth of the WDM signal prior to wavelength conversion between the average frequency $\omega_0$ of the two pump lightwaves and the frequency $\omega_{p2}$ of the second pump light, as equations (15), (16) and (17) are met in this case as well.

In either case, to prevent the channel frequency of the WDM converted signal from overlapping the noise signal originating from improper FWM, the conversion band $F_w$, given by $(\omega_{p2}-\omega_0)$ or $(\omega_0-\omega_{p1})$, should be set equal to or greater than twice the frequency bandwidth of the WDM signal prior to wavelength conversion.

The foregoing description has been given of the case where the frequency intervals between the optical channels of the WDM signal prior to wavelength conversion are identical. The same conclusion, however, about the advantageous width of the conversion band $F_w$ can be derived in the case where the frequency intervals between the optical channels are not equal. Equations (15), (16), and (17) are satisfied with respect to the WDM signal whose channels do not have equal frequency intervals.

According to equation (15), when the WDM signal prior to wavelength conversion is positioned on the frequency axis on one side of the average frequency $\omega_0$, of the two pump lightwaves, the WDM converted signal lies on the other side of the average frequency $\omega_0$ on the frequency axis.

The frequencies of the WDM converted signal start at the frequency separated from the average frequency $\omega_0$ of the two pump lightwaves by the interval between the channel of the WDM signal prior to wavelength conversion which is closest to the frequency $\omega_0$. The frequency bandwidth of the WDM converted signal is the same as the frequency bandwidth of the WDM signal prior to wavelength conversion and the frequency $\omega_0$ of the two pump lightwaves.

Equation (16) can be satisfied with respect to the noise signal frequency $\omega_{njip1}$ produced by improper FWM with the WDM signal prior to wavelength conversion having optical channel frequencies $\omega_{si\ 1\ and\ \omega sj}$ and the first pump lightwave with frequency $\omega_{p1}$.

Equation (17) can be satisfied with respect to the noise signal frequency $\omega_{njip2}$ produced by improper FWM with the WDM signal prior wavelength conversion having optical channel frequencies $\omega_{si}$ and $\omega_{sj}$ and the second pump lightwave with frequency $\omega_{p2}$.

Therefore, the noise frequency $\omega_{njip1}$ and $\omega_{njip2}$ lies at the mirror symmetric position on both sides of the frequency $\omega_{p1}$ and $\omega_{p2}$ of the first pump lightwaves, extended the bandwidth with the WDM signal prior to wavelength conversion, and its frequency bandwidth becomes twice the frequency bandwidth of the WDM signal prior to wavelength conversion respectively.

When the WDM signal consists of optical channels having equal frequency intervals $\delta\omega$, the noise signal frequencies closest to the frequencies of the two pump lightwaves are separated by a distance $\delta\omega$ from the frequencies of the respective pump lightwaves on the frequency axes on both sides of the pump light frequencies.

When the WDM signal consists of optical channels having frequency intervals which are not equal, the noise signal frequencies closest to the frequencies of the two pump lightwaves lie on the frequency axes on both sides of the pump lightwave frequencies, but are separated from the frequencies of the respective pump lightwave frequencies by the narrowest frequency interval between the optical channels.

Whether the WDM signal light consists of optical channels with equal frequency intervals or unequal intervals, the noise signal frequencies closest to the two pump lightwaves frequencies merely have different positions on the frequency axes. In both cases, the distribution of the noise signal frequencies lie on the frequency axes on both sides of the frequencies $\omega_{p1}$ and $\omega_{p2}$ of the pump lightwaves, and the noise signal frequencies spread by the frequency bandwidth of the WDM signal prior to wavelength conversion, centered about the frequencies $\omega_{p1}$ and $\omega_{p2}$.

If the bandwidth of the guard band, GB, would be satisfied an equation (28), degradation of signal and noise ratio would be avoided in the case of slight overlapping the band of WDM optical signals and that of noise. The noise signal and the converted WDM optical signals don't overlap each other in this condition.

$$GB \neq 2m \cdot \delta\omega \qquad (28)$$

Figure 6:
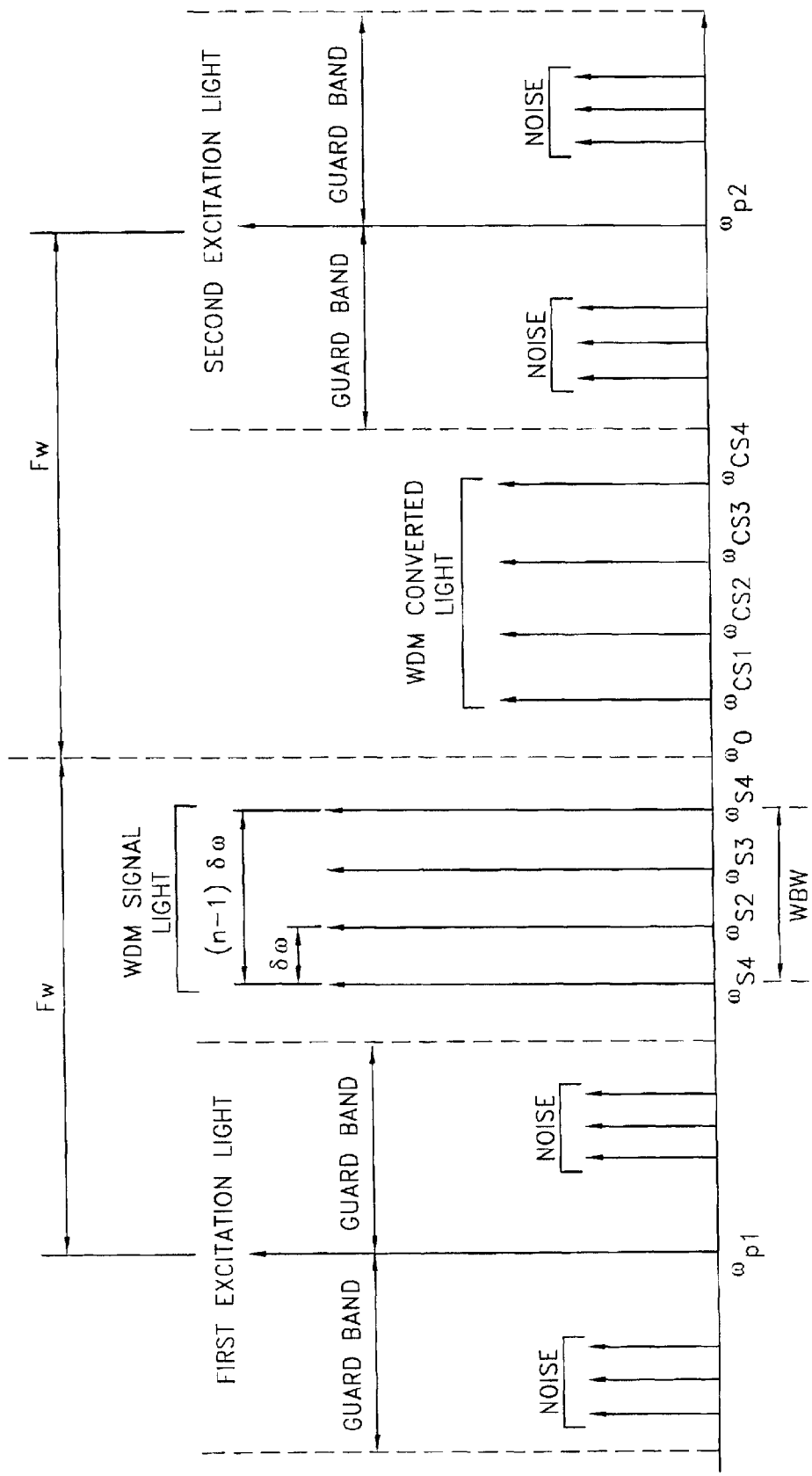
FIG. 6 is an exemplary graphical illustration of FWM of a WDM signal according to a second method of wavelength conversion.

FIG. 6 is an exemplary illustration of the positional relationship between the WDM signal prior to wavelength conversion, the WDM converted signal, pump lightwaves, and noise signals along the frequency axis.

As shown in FIG. 6, the bandwidth $F_w$ is set equal to or greater than twice the frequency bandwidth of the WDM signal prior to wavelength conversion and, the band of the WDM converted light is separated from the noise band, and both frequency bands do not overlap.

A second embodiment of a wavelength converter according to the second wavelength converting method (two-pump-lightwaves wavelength converting method) will be discussed below.

A FWM conversion medium can be implemented with a 100-m HNL-DSF with a zero dispersion wavelength of 1564 nm, 191.6 THz. The frequency $\omega_{p1}$ of the first pump light can be set to about 187.9 THz, and the frequency $\omega_{p2}$ of the second pump light can be set to about 195.3 THz. The average frequency $\omega_0$ will then be about 191.6 THz. In one embodiment, the bandwidth of the signals is chosen so that the width of the guard band is about 1.8 THz. For this embodiment, the equal frequency interval $\delta\omega$ was 0.2 THz, the channel quantity n was 7, and WDM signal light in the C band (1530 to 1565 nm) was wavelength-converted to the L band (1565 to 1625 nm). The resultant optical spectrum is shown in FIG. 7.

Figure 7:
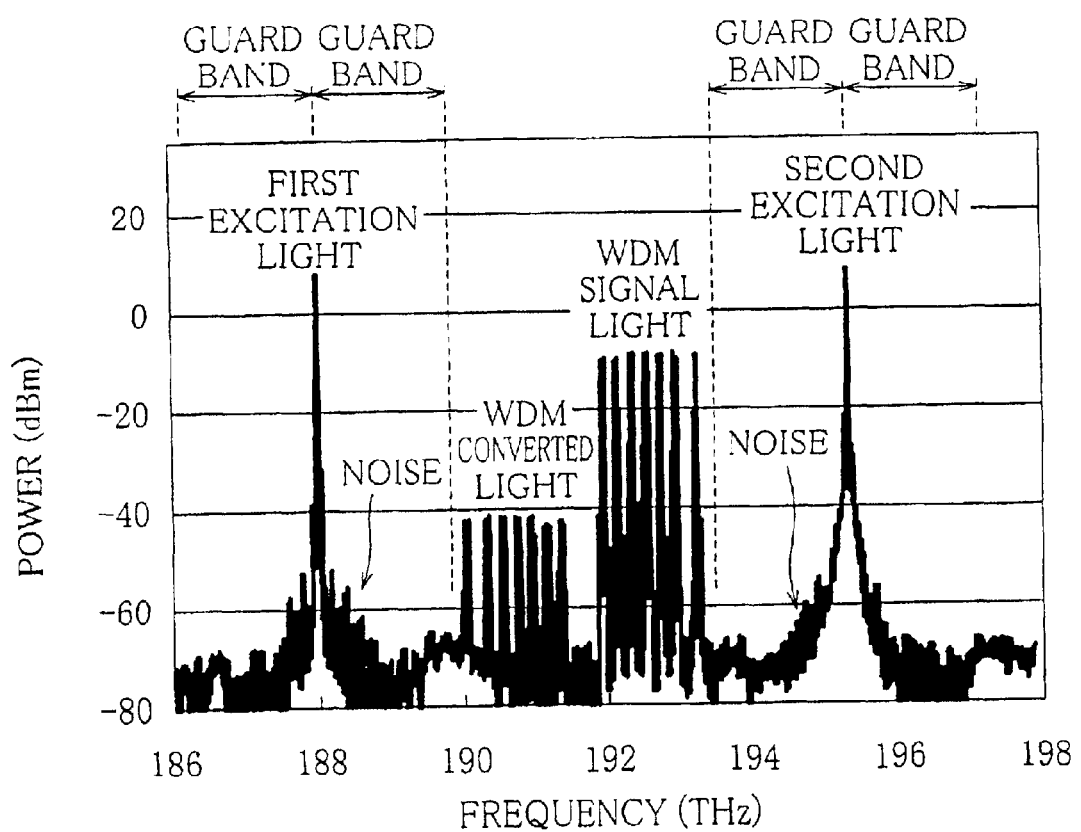
FIG. 7 is an optical spectrum illustrating wavelength conversion according to a second embodiment of a wavelength converter.

In FIG. 7, the band of the WDM converted signal does not overlap t that of noise generated by improper FWM. Because the SNR of signals after wavelength conversion (WDM signal and WDM converted signal) relative to the noise should be equal to or greater than 30 dB, the obtained signals maintain their characteristics as high quality as light sources.

It is therefore possible to produce the wavelength-converted WDM signal without producing noise by extracting only the WDM converted light using, for example, a band-pass filter.

In this embodiment, the average of the frequencies $\omega_{p1}$ and $\omega_{p2}$ of the two pump lightwaves may advantageously be matched with the zero dispersion wavelength of the conversion medium. The channel frequency of the WDM signal prior to wavelength conversion is given by $\omega_{si}$ and the channel frequency of the WDM converted signal which is produced at the mirror symmetric positions centered about the average frequency $\omega_0$ of the two pump lightwaves is given by $\omega_{csi}$. The propagation constants of the frequencies $\omega_{p1}$ and $\omega_{p2}$ of the two pump lightwaves propagating in the conversion medium where FWM occurs, and the frequencies $\omega_{si}$ and $\omega_{csi}$ are respectively given as $\beta_{p1}$, $\beta_{p2}$, $\beta_{si}$, and $\beta_{csi}$.

In this case, the phase matching condition is given by the following equation:

$$\Delta\beta = \beta_{p1} + \beta_{p2} - \beta_{si} - \beta_{csi} \quad (29)$$

The frequencies $\omega_{p1}$ and $\omega_{p2}$ are located at mirror symmetric positions on the frequency axis centered about the frequency $\omega_0$. Therefore, the positions of the propagation constants $\beta_{p1}$ and $\beta_{p2}$ on the frequency axis lie at positions which are equal in a distance $\Delta\omega_1$ on the frequency axis from the frequency $\omega_0$ to the frequencies $\omega_{p1}$ and $\omega_{p2}$, and have different signs on the frequency axis where the frequency $\omega_0$ is designated as zero.

Similarly, the propagation constants $\beta_{si}$ and $\beta_{csi}$ are located at mirror symmetric positions on the frequency axis centered about the frequency $\omega_0$. Therefore, the positions of the propagation constants $\beta_{s1}$ and $\beta_{csi}$ on the frequency axis are equal in distance $\Delta\omega_2$ on the frequency axis from the frequency $\omega_0$ to the frequencies $\omega_{s1}$ and $\omega_{csi}$, and have different signs on the frequency axis where the frequency $\omega_0$ is designated as zero.

Substituting $\Delta\beta$ in a Taylor expansion equation about the frequency $\omega_0$ under the following conditions leaves even power terms of $(\omega_1)$, such as $(\Delta\omega_2)^2$ and $(\Delta\omega_2)^4$. Because the coefficients for the Taylor expansion for $(\Delta\omega_1)^2$ and $(\Delta\omega_2)^2$ are dispersion values at the frequency $\omega_0$, equivalent to the zero dispersion wavelength of the conversion medium that performs FWM-based wavelength conversion, the values are zero.

Therefore, even power terms of $(\Delta\omega_1)$ and $(\Delta\omega_2)$ of the fourth power or higher remain in the Taylor expansion equation. If even power terms of $(\Delta\omega_1)$ and $(\Delta\omega_2)$ which are equal to or higher than the fourth power are small enough to be negligible, then $\Delta\beta$ becomes zero.

As $\Delta\beta$ becomes smaller, the wavelength conversion efficiency in FWM becomes higher. To increase the wavelength conversion efficiency in FWM, therefore, the frequency of the WDM converted signal is preferably set closer to the frequency equivalent to the zero dispersion wavelength of the conversion medium.

In view of the above, the average frequency $\omega_0$ of the two pump lightwaves is preferably matched with the frequency equivalent to the zero dispersion wavelength of the conversion medium in the foregoing description.

In the case of the first wavelength converting method, a WDM signal prior to wavelength conversion is set on one side of the frequency of a single pump lightwave on the frequency axis, the interval between the frequency of the pump lightwave and that of the frequencies of the WDM signal prior to wavelength conversion which is closest to the former frequency is set wider than the frequency bandwidth of the WDM signal light, and FWM-based wavelength conversion is carried out.

As a result, WDM converted signals can be produced at the mirror symmetric positions around the frequency of the pump lightwave, and noise is generated in the guard bands by improper FWM.

In the case of the second wavelength converting method, a WDM signal prior to wavelength conversion is set between the average frequency of two pump lights and the frequency of one of the two pump lights, the interval between the frequency of one of the pump lights and the average frequency of the two pump lights is set equal to or higher than twice the frequency bandwidth of the WDM signal prior to wavelength conversion, and FWM-based wavelength conversion is carried out.

As a result, WDM converted signals can be produced at the mirror symmetric positions around the average frequency of the two pump lights in the guard bands, and noise is generated around the individual pump lights outside the guard bands by improper FWM.

In either the first wavelength converting method or the second wavelength converting method, the frequency band of the WDM converted light does not overlap the frequency band of noise generated by improper FWM.

According to one embodiment of the wavelength converting method, WDM signal light which lies in either the S band (1460 to 1530 nm), the C band (1530 to 1565 nm) or the L band (1565 to 1625 nm) can be wavelength-converted to another band without generating noise. Wavelength conversion free of noise can also be realized within the same band.

In the case of the first wavelength converting method, for example, as WDM signal light which lies in a certain band is subjected to wavelength conversion to produce WDM converted light outside the guard band, and a band-pass filter which passes only converted light is used in that WDM, it is possible to acquire wavelength-converted WDM light free of noise.

In the case of a semiconductor laser device, such as a signal light source for optical communications, the adaptation of the first wavelength conversion method can allow WDM signal light in the L band to be wavelength-converted to the S band without noise. Such a case will be discussed below as an additional embodiment.

EXAMPLE 1

Conversion From L-band to S-band

Pump light: 195 THz

Number of Channels: 21

Interval Between Channels: 200 GHz

Signal Channel Frequency Range: 186–190 THz

Converted Channel Frequency Range: 200–204 THz

In this example, a single pump lightwave with a frequency of about 195 THz is applied to a conversion medium, the guard band is set to 4 THz, the equal frequency interval is 200 GHz, the channel quantity is 21 and WDM signal light in the L band, which has a frequency bandwidth of 180 to 190 THz, is subjected to FWM. Thus, as explained above, the bandwidth spanned by the signals (about 4 THz, as 21 channels with 200 GHz between each channel spans 4 THz) is slightly less than the distance between the highest signal frequency (about 190 THz) and the pump wavelength (about 195 THz).

WDM converted light in the S band, having the equal frequency interval of 200 GHz, twenty-one channels, and a frequency bandwidth of 200 to 204 THz, is produced outside the guard band, and, at the same time, noise with frequency bandwidths of 191 to 199 THz are generated around the frequency of 195 THz of the pump lightwave in the guard band.

As the entire WDM converted signal is passed through a band-pass filter, which has a cut-off at about 199 THz or lower, noise-free WDM converted light in the S band can be produced in the frequency bandwidth of 200 to 204 THz. Thus, such a wavelength converter producing WDM converted light can be used effectively in communications.

EXAMPLE 2

Conversion Within the C-band

Pump light: 190 THz and 196 THz

Number of Channels: 6

Interval Between Channels: 200 GHz

Signal Channel Frequency Range: 192 to 193 THz

Converted Channel Frequency Range: 193 to 194 THz

In this example, WDM signal light in the C band, having an equal frequency interval of about 200 GHz, six channels and a frequency bandwidth of about 192 to 193 THz, is wavelength-converted to WDM converted light in the same C band which has the equal frequency interval of about 200 GHz, six channels and a frequency bandwidth of about 193 to 194 THz. In this case, therefore, it can be seen that the signal channel bandwidth is about 1 THz (6 channels separated by 200 GHz each). Furthermore, the signal frequencies (at 192–193 THz) are between the lower pump frequency (190 THz) and the average of the two pump frequencies (193 THz). In addition, the lower pump frequency is separated from the higher pump frequency by at least four times the bandwidth spanned by the signal channels.

As set forth above, the frequencies of the individual pump lightwaves can be set such that the average frequency of two pump lightwaves becomes approximately 193 THz. For example, the frequency of one of the pump lightwaves can be set to a value equal to or lower than 190 THz, and the frequency of the other pump lightwave can be set to a value equal to or higher than 196 THz. In this example, the pump lightwave frequencies were respectively set to about 190 THz and 196 THz respectively, and the width of the guard band was set to 1 THz.

FWM can then generate WDM converted light having an equal frequency interval of about 200 GHz, six channels, and a frequency bandwidth of about 193 to 194 THz in the guard band. Inside the guard band, noise with a frequency bandwidth of about 189 to 191 THz will be generated around the frequency of 190 THz of one of the pump lights, and noise with a frequency bandwidth of 195 to 197 THz is generated around the frequency of 196 THz of the other pump light.

Thereafter, the WDM converted signal is passed through a band-pass filter, where wavelength-converted, noise-free WDM signal light having a frequency bandwidth of 193 to 194 THz is extracted.

EXAMPLE 3

Conversion Within the C-band

Pump light: 190 THz and 196 THz

Number of Channels: 6

Interval Between Channels: 200 GHz

Signal Channel Frequencies: 193 to 194 THz

Converted Channel Frequencies: 192 to 193 THz

Another embodiment of wavelength conversion wavelength-converts WDM signal light in the C band, having an equal frequency interval of about 200 GHz, six channels, and a frequency bandwidth of about 193 to 194 THz, to WDM converted light in the same C band having the equal frequency interval of about 200 GHz, six channels, and a frequency bandwidth of about 192 to 193 THz.

The frequencies of the individual pump lightwaves can be set such that the average frequency of the two pump lightwaves is 193 THz. For example, the frequency of one of the pump lights can be set to a value equal to or lower than 190 THz, and the frequency of the other pump lightwave can be set to a value equal to or higher than 196 THz. In this embodiment of wavelength conversion, the pump lightwave frequencies were respectively set to about 190 THz and 196 THz, and the width of the guard band was set to about 1 THz.

FWM can then generate WDM converted light, having the equal frequency interval of 200 GHz, six channels, and a frequency bandwidth of about 192 to 193 THz in the guard band. Inside the guard band, noise with a frequency bandwidth of about 189 to 191 THz is generated around the frequency of 190 THz of one of the pump lightwaves, and noise with a frequency bandwidth of about 195 to 197 THz is generated around the frequency of 196 THz of the other pump lightwave.

Thereafter, the WDM converted light may be passed through a band-pass filter, and wavelength-converted, noise-free WDM signal light having a frequency bandwidth of about 192 to 193 THz is extracted.

In both Example 2 and Example 3 the average frequency (193 THz) of the two pump lightwaves overlaps a portion of the frequency band of WDM signal light prior to wavelength conversion. Because the average frequency is not real, however, it is unnecessary to filter out the average frequency.

In the event wavelength conversion is executed in the same band, such as the C band, in the second wavelength converting method, the average frequency of the two pump lightwaves can be set close to either the highest or lowest frequency of the WDM signal prior to wavelength conversion. Such a method can effectively utilize the frequency band and is generally suitable for implementation.

In the event the wavelength converting method of the present invention is used when WDM signal light is sent to an access network from a main network, or to the main network from an access network, in an optical communication system, it is preferable that after FWM-based wavelength conversion, WDM signal light is amplified by, for example, an EDFA before being distributed to individual networks.

In the case of the second wavelength converting method, for example, if the signal is passed through a band-pass filter after FWM-based wavelength conversion to eliminate only the noise frequency, then the WDM signal prior to wavelength conversion and the WDM converted signal after FWM-based wavelength conversion are acquired at the output of the filter.

As one of the WDM signals is dropped and the other WDM signal is returned to the original transmission path, wavelength selective demultiplexing can be realized. If the WDM signals are applied to an arrayed waveguide, the WDM signal prior to wavelength conversion and the WDM converted signal appear in the output waveguide channel by channel. The use of the wavelength converting method of the present invention, therefore, can provide for the design of a variety of multifunction optical communication components and systems.

The use of both the first wavelength converting method and the second wavelength converting method of the present invention can provide a wavelength converter which acquires WDM converted light which is completely free of noise generated by improper FWM. One embodiment of such a wavelength converter 300 is illustrated in the block diagram of FIG. 8.

Figure 8:
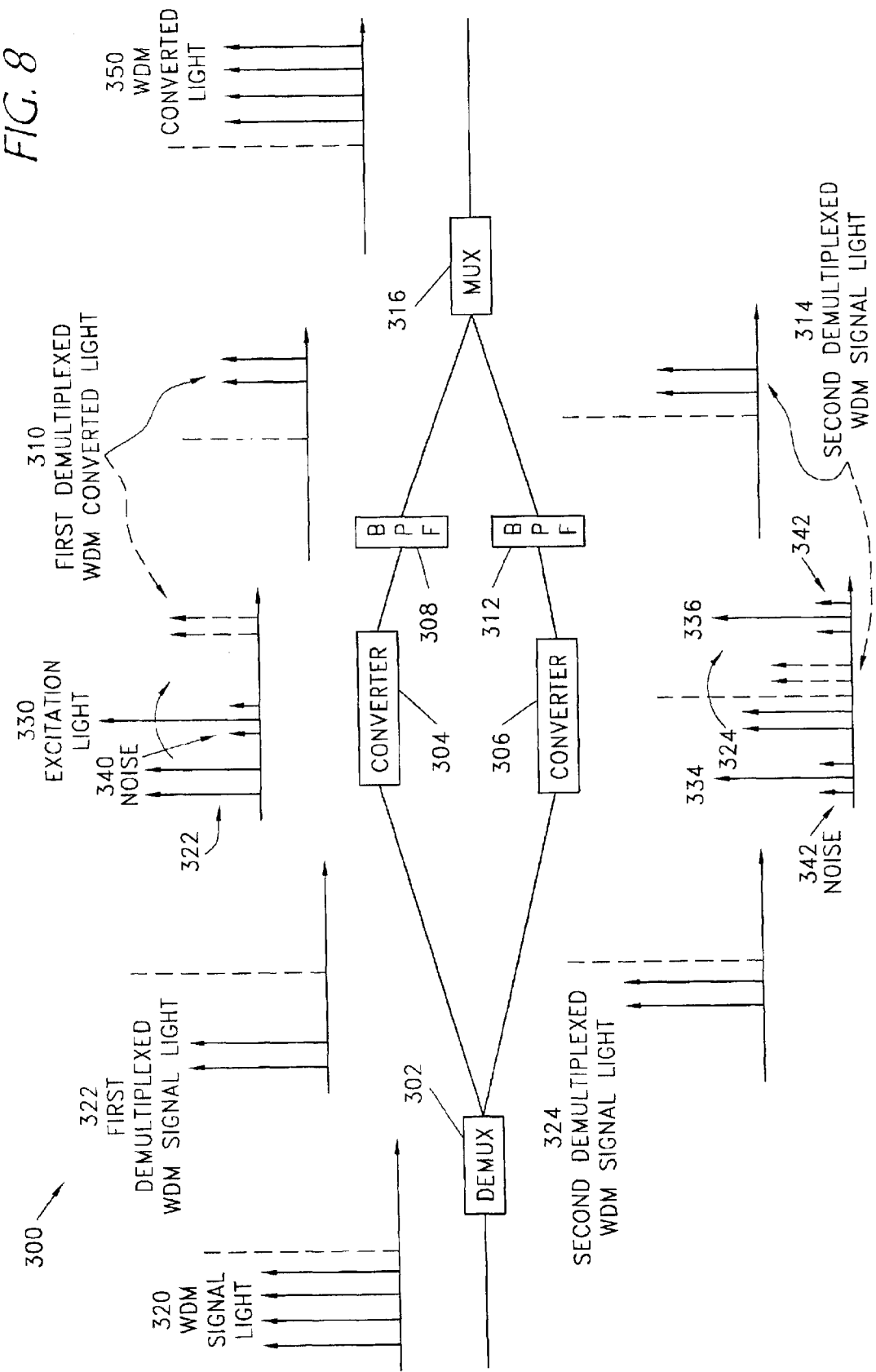
FIG. 8 is a block diagram of one embodiment of a wavelength converter according to the present invention.

The wavelength converter 300 comprises a demultiplexer 302, a first wavelength converting section 304 which executes the first wavelength converting method, a second wavelength converting section 306 which executes the second wavelength converting method, a first filter 308 which passes only first WDM converted light 310 in the output of the first wavelength converting section 304, a second filter 312 which passes only second WDM converted light 314 in the output of the second wavelength converting section 306, and a multiplexer 316, which multiplexes the first WDM converted light 310 and the second WDM converted light 314, as shown in FIG. 8.

In the wavelength converter 300, WDM signal light 320 for wavelength conversion is applied to the demultiplexer 302. The demultiplexer 302 demultiplexes the input WDM signal 320 into two WDM signals of different frequency bands 322, 324, wherein the first demodulated WDM signal 322 is input to the first wavelength converting section 304 while the second demultiplexed WDM signal 324 is input to the second wavelength converting section 306.

The first wavelength converting section 304 can have a conversion medium into which the first demultiplexed WDM signal 322 and one pump lightwave 330 enter. The wavelength converting section 304 can be designed such that the interval between a frequency of the first demultiplexed WDM signal 322 closest to the frequency of the single pump lightwave 330, and the frequency of the pump lightwave 330 becomes, as the guard band, equal to or larger than the frequency bandwidth of the first demultiplexed WDM signal 322.

The second wavelength converting section 306 can have a conversion medium into which the second demultiplexed WDM signal 324 and two pump lightwaves 334, 336 enter. The second wavelength converting section 306 can be designed such that the frequency of the second demultiplexed WDM signal 324 is positioned between the average frequency of the two pump lightwaves 334, 336 and a frequency of the two pump lightwaves 334, 336, and the interval between that one frequency and the average frequency becomes, as the guard band, equal to or larger than twice the frequency bandwidth of the second demultiplexed WDM signal 324.

The first demultiplexed WDM signal 322 from the demultiplexer 302 can be demultiplexed so as to include the frequency component that lies closest to the frequency of the one pump lightwave 330 discussed above. The second demultiplexed WDM signal 324 from the demultiplexer 302 can be demultiplexed so as to include the frequency components that lie closest to the average frequency of the two pump lightwaves 334, 336.

In the first wavelength converting section 304, the wavelength-converted first demultiplexed WDM converted signal 310 is produced at the mirror symmetric positions on the frequency axis, centered about the frequency of the single pump lightwave 330, i.e., outside of the guard band, by FWM of the first demultiplexed WDM signal 322 and the single pump lightwave 330. At the same time, noise 340 frequencies originating from improper FWM are generated in the guard band.

In the second wavelength converting section 306, the wavelength-converted second demultiplexed WDM converted signal 314 is produced at the mirror symmetric positions on the frequency axis, centered about the average frequency of the two pump lightwaves 334, 336, i.e., inside the guard band, by FWM of the input second demultiplexed WDM 324 signal and the two pump lightwaves 334, 336. At the same time, noise 342 frequencies originating from improper FWM are generated outside the guard band.

The output of the first wavelength converting section 304 is applied to the first filter 308 and only the first demultiplexed WDM converted signal 310 passes through the first filter 308. That is, the first demultiplexed WDM signal 322, the pump lightwave 330, and noise 340 can all be eliminated.

The output of the second wavelength converting section 306 is applied to the second filter 312 and only the second demultiplexed WDM converted signal 314 passes through the second filter 312. That is, the second demultiplexed WDM signal 324, the pump lightwaves 334, 336, and noise 342 can all be eliminated.

Following the filters 308, 312, the converted signals 310, 314 are multiplexed by the multiplexer 316. This provides WDM converted light 350 which is wavelength-converted light of WDM signal light 320 and can be completely free of noise 340, 342 generated by improper FWM.

The demultiplexer 302 and the multiplexer 316 can be implemented, for example, with an arrayed waveguide type demultiplexer and Mach-Zehnder type multiplexer, respectively.

Given that a first branch in the wavelength converter shown in FIG. 8 incorporates the first wavelength converting section 304 and the first filter 308, and a second branch incorporates the second wavelength converting section 306 and the second filter 312, the guard band will be empty and no noise will be present on the output side of the first branch. However, on the output side of the second branch, only WDM converted light will be present in the guard band of the first branch. After the WDM converted signals pass through the multiplexer 316, the formerly empty guard band is filled with the frequency band of the latter WDM converted signal. Therefore, the optical frequency band can be used effectively in such a wavelength converter.

In operation, when the frequency bandwidth of the WDM signal prior to wavelength conversion is wide, it may be beneficial for the WDM signal to be demultiplexed to a plurality of WDM signals having narrower frequency bandwidths before using the wavelength converter. This can be beneficial because the guard band specified by the frequency bandwidth of the WDM signal prior to wavelength conversion and the FWM conversion efficiency becomes low when the frequency bandwidth of the WDM signal prior to wavelength conversion is wide.

In consideration of the conversion efficiency, in the case of the second wavelength converting method, WDM converted light is present between the average frequency of two pump lightwaves and the guard band whose frequency bandwidth is equal to or higher than the frequency bandwidth of WDM signal light that is to be wavelength-converted, and no pump lightwave is present at the position of the average frequency. The second wavelength converting method therefore does not require filtering of the pump lightwaves and the WDM signal, and thus can be advantageous in the effective use of the optical frequency band.

In view of the above, when the frequency bandwidth of the WDM signal to be wavelength-converted is wide, it can be divided by N. Then, the frequency of a single pump lightwave in the first branch can be set equal to the average frequency of the two pump lightwaves in the second branch. Of the WDM signals resulting from the division by N, the WDM signal that includes the channel whose frequency is closest to the aforesaid average frequency can be wavelength-converted by the second branch. The width of the guard band in the second branch can be set equal to or greater than twice the frequency bandwidth of the WDM signal.

Meanwhile, N-1 branches with single pump sources can be combined in parallel and N-1 divided WDM signals are respectively assigned to these N-1 branches and subjected to wavelength conversion. Naturally, the width of the guard band in each of these branches can be set equal to or greater than the frequency bandwidth of the respectively-assigned divided WDM signals.

As the frequency of the pump lightwave in the single pump source branch is set equal to the average frequency of the two pump lightwaves in the second, two pump source branch, no frequency skip occurs in the WDM converted signal after FWM-based wavelength conversion.

As the N-1 single source branches and the two pump source branch are combined in parallel under the aforesaid configuration, and WDM converted signals that have been produced by the multiple branches are multiplexed, the overall optical frequency band can be used effectively.

In the aforementioned case, however, because the WDM signals entering the separate branches have certain assigned frequency bands, the WDM signal that is transferred over the main transmission path is preferably demultiplexed so as to have frequency components that can be separately processed by the separate branches. To meet such an objective, an arrayed waveguide demultiplexer can be used. Specifically, one of the input lines of the arrayed waveguide demultiplexer can be connected to the main transmission path. As a result, the WDM signal according to each frequency band can be produced from each output waveguide on the output side.

If the individual output waveguides corresponding to the output WDM signals are multiplexed together so as to have the frequency components that are respectively assigned to the separate branches, the demultiplexer would have N frequency components assigned, respectively, to the first branch and the second branch. The multiplexer can be constructed by connecting N output terminals of the branches to an N-to-1 combining unit.

EXAMPLE 4

Conversion From C-band to L-band

Pump light: First Branch: 191 THz
Second Branch: 187 THz and 195 THz
Number of Channels: 16
Interval Between Channels: 200 GHz
Signal Channel Frequencies: 192 to 195 THz
Converted Channel Frequencies: 187 to 190 THz In this example, WDM signal light in the C band, having a frequency bandwidth of about 192 to 195 THz, an equal inter-channel frequency interval of about 200 GHz, and sixteen channels can be wavelength-converted to WDM signal light in the L band which has a frequency bandwidth of about 187 to 190 THz, the equal inter-channel frequency interval of about 200 GHz and sixteen channels.

The WDM signal light in the C band can be applied to the demultiplexer and demultiplexed into a first demultiplexed WDM signal having the equal inter-channel frequency interval of 200 GHz, eight channels, and a frequency bandwidth of about 193.6 to 195 THz, and a second demultiplexed WDM signal having the equal inter-channel frequency interval of 200 GHz, eight channels, and a frequency bandwidth of about 192 to 193.4 THz. The first and second demultiplexed WDM signals can be applied to the first wavelength converting section 304 and the second wavelength converting section 306, respectively.

With regard to the first wavelength converting section 304, the frequency of a single pump lightwave can be set to 191 THz, and the width of the guard band can be set to 2.6 THz. The first wavelength converting section 304 provides WDM converted light with the equal frequency interval of 200 GHz, eight channels, and a frequency bandwidth of 187 to 188.4 THz outside the guard band, and noise with a frequency band of about 189.6 THz to 192.4 THz in the guard band.

The WDM converted light and the noise can be applied to the first filter 308 to filter out the noise with a frequency band of about 189.6 THz or higher and the first demultiplexed WDM signal.

Because the target frequency band of the second wavelength converting section 306 is about 192 to 193.4 THz, the frequencies of two pump lightwaves can be selected so that their average frequency is about 191 THz. For example, the frequency of one pump lightwave can be set to 187 THz or lower, and the frequency of the other pump lightwave can be set to 195 THz or higher. In this embodiment, the frequency of one pump lightwave is set to about 187 THz while the frequency of the other pump lightwave is set to about 195 THz. Further, the width of the guard band can be set to 2 THz.

The second wavelength converting section 306 provides WDM converted light having eight channels, the equal frequency interval of 200 GHz, and a frequency bandwidth of about 188.6 to 190 THz inside the guard band, noise spreading in a frequency band of 185.6 to 188.4 THz around the frequency of 187 THz of one pump lightwave outside the guard band, and noise spreading in a frequency band of 193.6 to 196.4 THz around the frequency of 195 THz of the other pump lightwave outside the guard band.

The WDM converted light and the noise can be applied to the second filter (band-pass filter) 312 to pass only the WDM converted light with a frequency band of 188.6 to 190 THz.

Finally, the WDM converted signals from the first filter 308 and the second filter 312 can be applied to the multiplexer 316. As a result, WDM converted signal light having the equal frequency interval of 200 GHz, sixteen channels, and a frequency bandwidth of 187 to 190 THz can be produced.

EXAMPLE 5

Conversion From the L-band to the C-band

Although the preceding example of a wavelength converter wavelength-converts WDM signal light present in the C band to the L band without noise, WDM signal light present in the L band can be wavelength-converted to the C band without noise by using the wavelength converter of the present invention. In this case, the process of wavelength conversion to the L band from the C band should be reversed.

The wavelength conversion to the L band from the C band is discussed as in this example. In the this embodiment, WDM signal light in the L band, having an equal inter-channel frequency interval of about 200 GHz, sixteen channels, and a frequency bandwidth of about 187 to 190 THz, can be wavelength-converted to WDM signal light in the C band, having the equal inter-channel frequency interval of about 200 GHz, sixteen channels, and a frequency bandwidth of about 192 to 195 THz.

The WDM signal light in the L band can be applied to the demultiplexer 302 and is demultiplexed into a first demultiplexed WDM converted signal having the equal inter-channel frequency interval of about 200 GHz, eight channels, and a frequency bandwidth of about 187 to 188.4 THz, and a second demultiplexed WDM converted signal having the equal inter-channel frequency interval of about 200 GHz, eight channels and a frequency bandwidth of about 188.6 to 190 THz. The first and second demultiplexed WDM signals can be applied to the first wavelength converting section 304 and the second wavelength converting section 306, respectively.

With respect to the first wavelength converting section 304, the frequency of about 191 THz of a single pump lightwave can be used and the width of the guard band can be set to about 1.4 THz.

The first wavelength converting section 304 provides a WDM converted signal having the equal frequency interval of about 200 GHz, eight channels, and a frequency bandwidth of 193.6 to 195 THz outside the guard band, a WDM converted signal having a frequency bandwidth of about 193.6 to 195 THz around the frequency of about 191 THz of the pump lightwave inside the guard band, and noise having a frequency band of about 189.6 THz to 192.4 THz around the frequency of 1 about 91 THz of the pump lightwave inside the guard band.

The WDM converted signals and the noise can be applied to the first filter 308 to filter out the noises with a frequency band of about 192.4 THz or lower, and the first demultiplexed WDM converted signal, such that WDM converted light having a frequency band of about 193.6 to 195 THz is extracted.

Because the target frequency band of the second wavelength converting section 306 is about 188.6 to 190 THz, the frequencies of two pump lightwaves can be selected such that their average frequency is about 191 THz. For example, the frequency of one pump lightwave can be set to about 187 THz or lower, and the frequency of the other pump lightwave can be set to 195 THz or higher. In this embodiment, the frequency of one pump lightwave is set to 187 THz while the frequency of the other pump lightwave is set to 195 THz. Further, the width of the guard band can be set to about 1.4 THz.

The second wavelength converting section 306 provides WDM converted light having eight channels, the equal frequency interval of about 200 GHz, and a frequency bandwidth of about 192 to 193.4 THz inside the guard band, noise spreading in a frequency band of about 185.6 to 188.4 THz around the frequency of about 187 THz of one pump lightwave outside the guard band, and noise spreading in a frequency band of about 193.6 to 196.4 THz around the frequency of about 195 THz of the other pump lightwave outside the guard band.

The WDM converted light and the noise can be applied to the second filter (band-pass filter) 312 to pass only the WDM converted light having a frequency band of about 192 to 193.4 THz.

Finally, the WDM converted signals from the first filter 308 and the second filter 312 can be applied to the multiplexer 316, thus providing WDM converted light having the equal frequency interval of 200 GHz, sixteen channels, and a frequency bandwidth of about 192 to 195 THz.

Referring to FIG. 8, if a band-pass filter which eliminates only noise in the guard band is used as the first filter 308, and a band-pass filter which passes only the frequency band in the guard band is used as the second filter 312, for example, WDM signal light prior to wavelength conversion and WDM converted light without noise can be produced after the WDM signals pass through the multiplexer 316. That is, a signal whose wavelength channels become twice the channel frequency of the WDM signal prior to wavelength conversion can be produced.

Therefore, the use of the wavelength converter as a light source can provide a signal having twice the channel frequency of the input signal per single light source. Such a wavelength converter can thus reduce the number of laser diodes used in a light source.

If a plurality of light sources of this type are connected in series, for example, it is possible to construct a light source which provides a signal light whose channel frequency increases to two times, four times, eight times and so forth, depending on the number of light sources implemented. When light sources of the present invention are used, the number of laser diodes required to produce such an effect decreases to ½, ¼, ⅛ and so forth in order. This makes the entire light source more compact in size and reduces the cost thereof.

Figure 9:
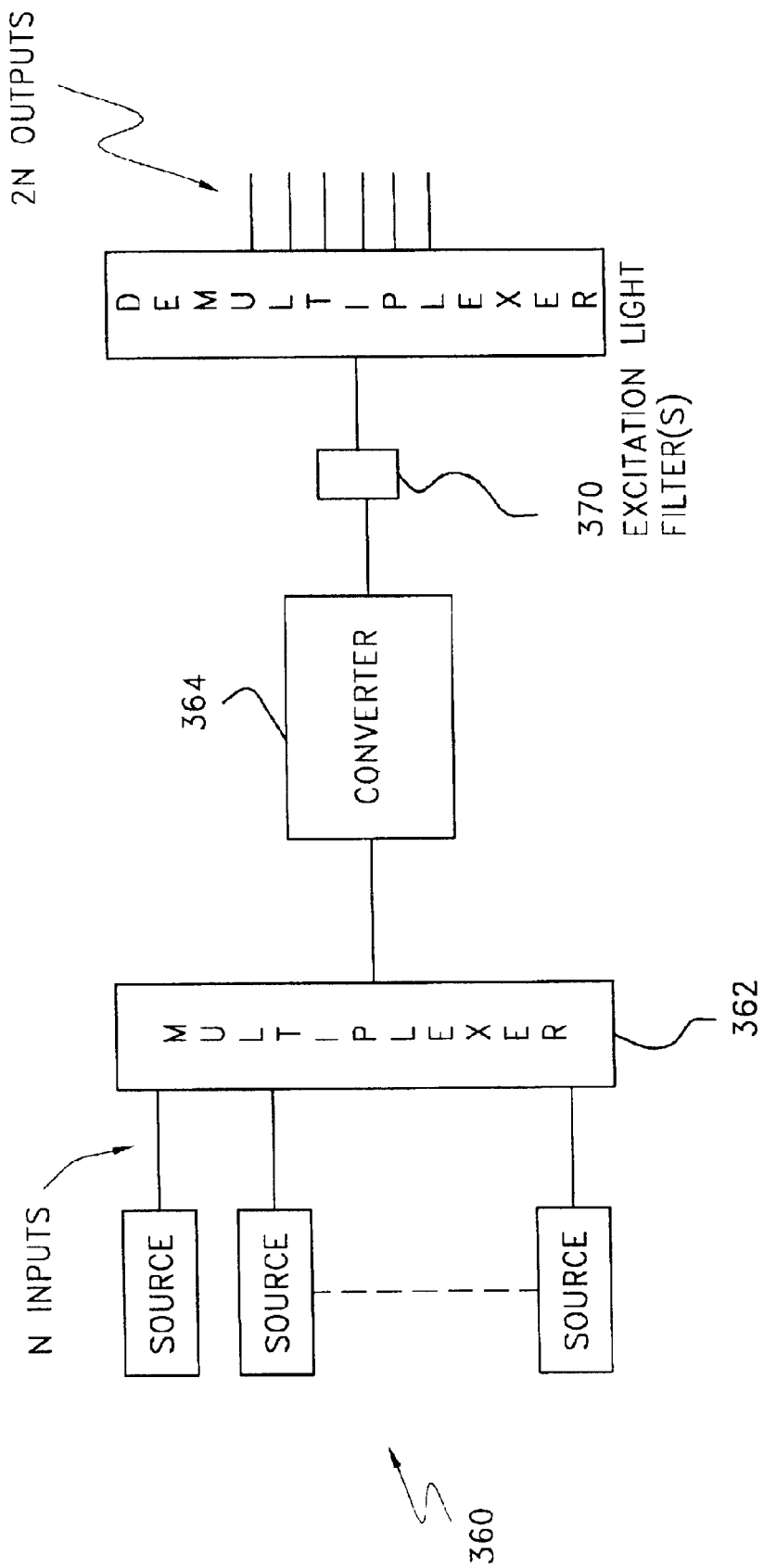
FIG. 9 is a block diagram of a multi-wavelength light source according to one embodiment of the invention.

This embodiment of the invention is illustrated in FIG. 9. In this embodiment, a plurality of light sources such as laser diodes 360 have outputs that are multiplexed together by a multiplexer 362. The output of the multiplexer is routed to a four-wave mixer 364 and pump source filter/filters 370 connected in series. These components may, for example, be configured as shown in FIG. 8, wherein the filter or filters 370 pass both the converted light and the original signal light, but block the pump lightwave and noise signals. This produces 2N WDM outputs from only N laser diodes. If desired, the outputs may be demultiplexed into 2N separate light sources by a demultiplexer 372.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A method of wavelength conversion of a plurality of optical signal channels spanning a frequency bandwidth, said method comprising: four-wave mixing, in a conversion medium, said plurality of optical signal channels and first and second pump lightwaves having first and second frequencies respectively; selecting frequencies for said first and second pump lightwaves such that (1) the optical signal channel frequencies lie between said first pump lightwave frequency and an average frequency of said two pump lightwave frequencies, and (2) the frequency difference between said first and second pump frequencies is at least about four times the frequency span of said optical signal channels.

2. The method of claim 1, wherein said average frequencies of pump lightwaves is approximately equal to a zero dispersion frequency of said conversion medium.

3. The method of claim 1, wherein said conversion medium exhibits a non-linear optical property.

4. A wavelength converter comprising:
a demultiplexer, configured to demultiplex a wavelength division multiplexed (WDM) optical signal into at least two demultiplexed WDM optical signals, wherein a first demultiplexed WDM optical signal has a first frequency bandwidth and a second demultiplexed WDM optical signal has a second frequency bandwidth;
a first wavelength converting section comprising a first conversion medium configured to receive said first demultiplexed WDM optical signal and a pump lightwave, wherein there is an interval between a frequency of said pump lightwave and one frequency of said demultiplexed WDM optical signal with a frequency closest to said frequency of said pump lightwave, and said interval between said pump lightwave and said first demultiplexed WDM optical signal is equal to or greater than said first frequency bandwidth of said first demultiplexed WDM optical signal, and wherein a first output signal, including a first wavelength converted WDM optical signal, is produced at an output of said first wavelength converting section;

a second wavelength converting section comprising a second conversion medium configured to receive said second demultiplexed WDM optical signal and a first and second pump lightwaves, wherein said second demultiplexed WDM optical signal is in a frequency bandwidth between a frequency of said first pump lightwave and an average frequency of said first and second pump lightwaves, wherein a frequency bandwidth between said first frequency of said first pump lightwave and said second demultiplexed WDM optical signal with a frequency closest to said first pump lightwave is set equal to or greater than said frequency bandwidth of said second demultiplexed WDM optical signal, and wherein a second output signal, including a second wavelength converted WDM optical signal, is produced at an output of said second wavelength converting section;

a first filter, coupled to said first wavelength converting section, configured to receive said first output signal and to pass only said first wavelength converted WDM optical signal;

a second filter, coupled to said second wavelength converting section, configured to receive said second output signal and to pass only said second wavelength converted WVDM optical signal; and a multiplexer, coupled to said first filter and said second filter, configured to multiplex said first wavelength converted WDM optical signal from said first filter and said second wavelength converted WDM optical signal from said second filter.

5. The wavelength converter of claim 4, wherein said frequency of said pump lightwave in said first wavelength converting section is equal to a zero dispersion frequency of said first conversion medium.

6. The wavelength converter of claim 4, wherein said average frequency of said two pump lightwaves in said second wavelength converting section is equal to a zero dispersion frequency of said second conversion medium.

7. A method of wavelength converting a wavelength division multiplexed (WDM) optical signal having a bandwidth WBW, the method comprising injecting first and second pump lightwaves into a conversion medium with said WDM optical signal, wherein (1) said first pump lightwave has a frequency at least WBW less than the lowest frequency in said WDM optical signal, (2) the average frequency of said first and second pump lightwaves is higher than the highest frequency in said WDM optical signal, and (3) said second pump lightwave has a frequency at least 2WBW greater than an average frequency of said first and second pump lightwaves.

8. A method of wavelength converting a WDM optical signal having a bandwidth WBW, the method comprising injecting first and second pump lightwaves into a conversion medium with said WDM optical signal, wherein (1) said first pump lightwave has a frequency at least 2WBW less than said an average frequency of said first and second pump lightwaves, (2) said average frequency of said first and second pump lightwaves is less than the lowest frequency in said WDM optical signal, and (3) said second pump lightwave has a frequency at least WBW greater than the highest frequency in said WDM optical signal.

9. The method of claim 8, comprising combining said optical signal with at least two pump lightwaves.

10. The method of claim 9, comprising providing a guard band around all of said pump lightwaves.

11. The method of claim 8, comprising separating the frequencies present in said optical signal from the frequencies present in said pump lightwaves by an amount sufficient to separate noise frequencies from converted output signal frequencies.

* * * * *